United States Patent [19]

Chang

[11] Patent Number: 5,598,110
[45] Date of Patent: Jan. 28, 1997

US005598110A

[54] DETECTOR CIRCUIT FOR USE WITH TRI-STATE LOGIC DEVICES

[75] Inventor: Yao-Tsung Chang, Chung-Li, Taiwan

[73] Assignee: Acer Incorporated, Taipei, Taiwan

[21] Appl. No.: 332,834

[22] Filed: Nov. 1, 1994

[51] Int. Cl.$^6$ .............................................. H03K 19/0175
[52] U.S. Cl. .................. 326/60; 326/56; 326/59
[58] Field of Search .......................... 326/56–58, 60, 326/121; 327/74–76, 80–1

[56] References Cited

U.S. PATENT DOCUMENTS

| | | | |
|---|---|---|---|
| 3,969,633 | 7/1976 | Paluck | 326/60 |
| 4,005,315 | 1/1977 | Blauschild | 326/60 |
| 4,302,690 | 11/1981 | Gollinger | 326/60 |
| 5,045,728 | 9/1991 | Crafts | 326/60 |
| 5,124,590 | 6/1992 | Liu | 326/60 |
| 5,194,766 | 3/1993 | Sugawara | 326/60 |

*Primary Examiner*—Edward P. Westin
*Assistant Examiner*—Andrew Sanders
*Attorney, Agent, or Firm*—Townsend and Townsend and Crew

[57] ABSTRACT

A logic state detector that indicates a floating state of a tri-state logic circuit. The logic state detector generates first and second binary logic signals at a pair of output terminals. A first unique combination of the values of the output signals denotes that the input signal represents a logic low, a second unique combination denotes that the input signal represents a logic high, and a third unique combination denotes that the input signal is floating.

10 Claims, 11 Drawing Sheets

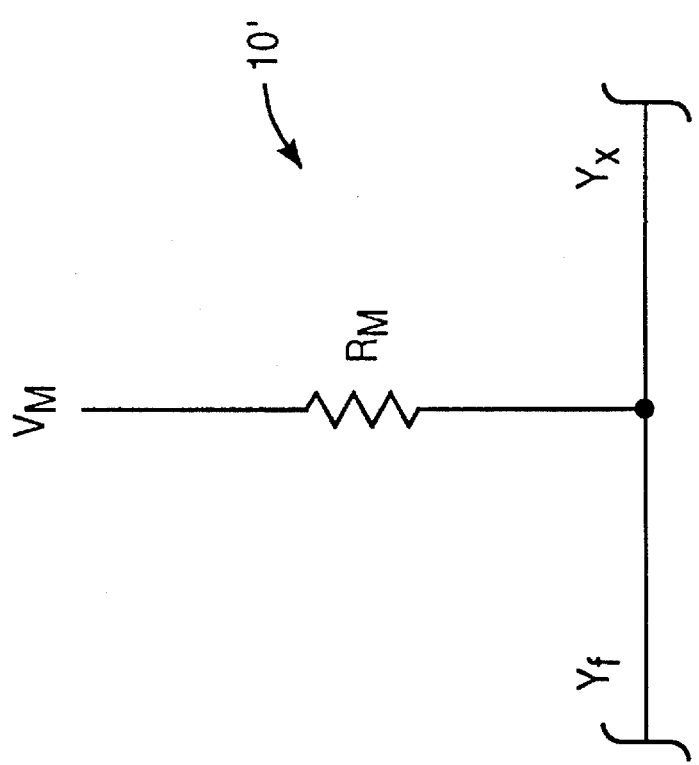

DETECTOR CIRCUIT FOR USE WITH TRI-STATE LOGIC DEVICES

BACKGROUND OF THE INVENTION

The present invention relates generally to digital logic, and more particularly to circuits incorporating tri-state logic elements.

Conventional logic elements are binary, and respond to or detect two states, a logic high state ("H") and logic low state ("L"). A particular type of logic device, referred to as a tri-state device includes a signal input terminal, a signal output terminal, and an output enable terminal. The output enable is normally shown as active low. When the output enable is active, the output is the same as the input. When the output enable terminal is inactive, the output is in a floating state ("F").

FIG. 1 shows a prior art tri-state device 1 having a conventional device 2 coupled to the output terminal. The input signal level is designated X, the output enable level is designated E, the output of the tri-state device is designated Y, and the output of the conventional device is designated Y'. The circuit has the following truth table:

| X  | E | Y | Y'     |
|----|---|---|--------|
| L  | L | L | L      |
| H  | L | H | H      |
| X* | H | F | L or H |

X* indicates that the relevant state may be "L" or "H". As can be seen, when E is low (output enabled), the signal at Y' follows the signal at Y, which follows the signal at X. When E is high (output not enabled), the signal at Y' is undetermined since the signal at Y is floating. Thus, it is not possible to determine whether the signal at Y is floating or has a particular value.

Tri-state gates are used for circuit isolation, or for such applications as a wire-OR or wire-AND circuit. FIG. 2 shows a wire-OR circuit 3 including first and second tri-state devices 4 and 5. The output terminals of the tri-state devices are tied to a circuit node O, which is pulled high through a pull-up resistor R. Node O represents the output terminal of the circuit. If either of the tri-state device's input is low, and if its output is enabled, the output at O will be pulled low. The floating state of a given one of the devices merely serves to isolate the device from the output terminal.

SUMMARY OF THE INVENTION

The present invention provides a logic state detector that indicates a floating state of a tri-state logic device.

In brief, the logic state detector according to the present invention generates first and second binary logic signals at a pair of output terminals. A first unique combination of the values of the output signals denotes that the input signal represents a logic low, a second unique combination denotes that the input signal represents a logic high, and a third unique combination denotes that the input signal is floating. In a specific embodiment, the logic state detector includes a voltage level generator and a signal detecting (comparison) circuit. The voltage level generator is responsive to the input signal, and generates a first voltage level when the input signal represents a logic low, a second voltage level when the input signal represents a logic high, and a third voltage level preferably between the first and second voltage levels, when the input signal is floating.

In a specific embodiment, the third voltage level is a reference level between the minimum of a reference high level and the maximum of a reference low level, and the signal detecting circuit includes first and second threshold circuits. The first threshold circuit provides a first signal indicating whether the voltage level from the voltage level generator is above a first threshold voltage and the second threshold circuit provides a second signal indicating whether the voltage level is above a second threshold voltage. The first threshold voltage is preferably between the minimum of the reference high voltage and the reference voltage while the second threshold voltage is preferably between the reference voltage and the maximum of the reference low.

In the specific embodiment, the circuitry further includes output logic for remapping the first and second signals to a pair of output signals. In a specific embodiment, the signal on the first output terminal tracks the input signal if the input signal is not floating while the signal on the second output terminal indicates whether the input signal is floating.

The logic state detector circuit according to the present invention can be put to additional uses. For example, it can be used in combination with a tri-state device over transmission lines so that a single line can transmit three states. Further, it can be connected to a transmission line to detect a broken line. Further yet, it can be used as a buffer between two tri-state circuits.

A further understanding of the nature and advantages of the present invention can be realized by reference to the remaining portions of the specification and drawings.

BRIEF DESCRIPTION OF THE DRAWINGS

FIG. 4A is a schematic view showing an alternative electrical level generator for a logic state detector according to the present invention;

DESCRIPTION OF SPECIFIC EMBODIMENTS

Logic Overview of a First Specific Embodiment

Figure 1:
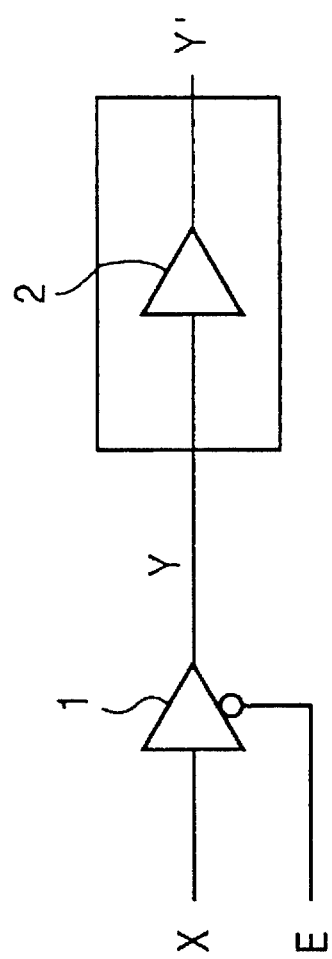
FIG. 1 is a schematic view showing a logic circuit using a tri-state device according to the prior art.
Figure 2:
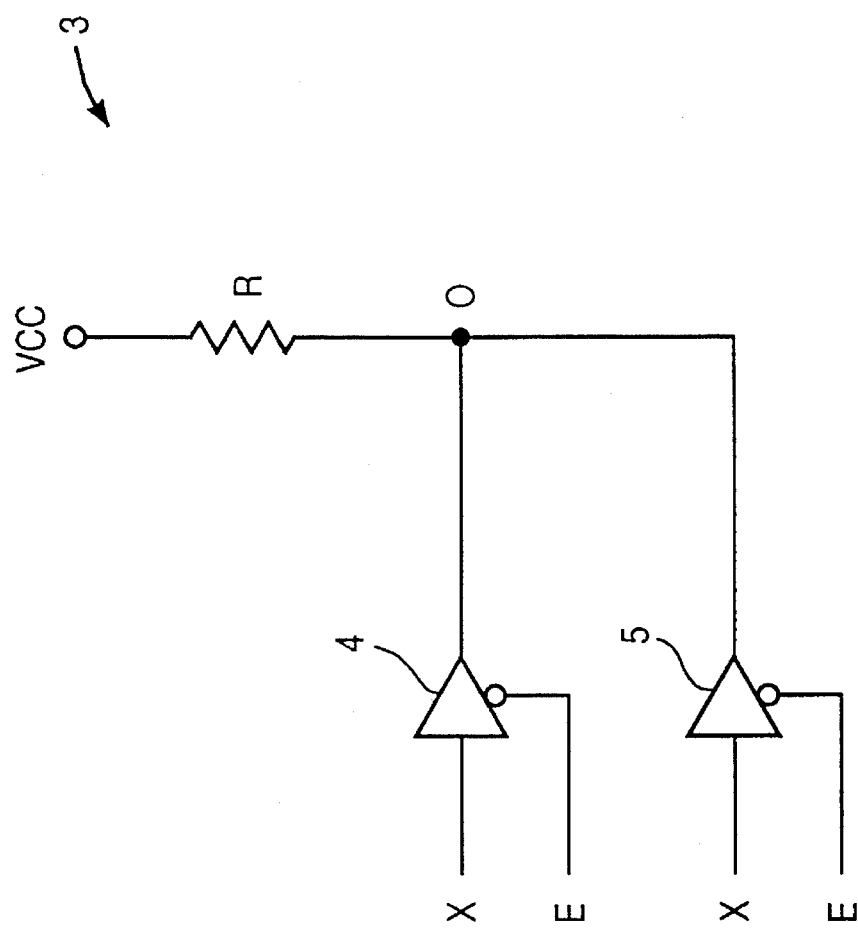
FIG. 2 is a circuit diagram showing a wire-OR circuit using tri-state devices according to the prior art.
Figure 3A:
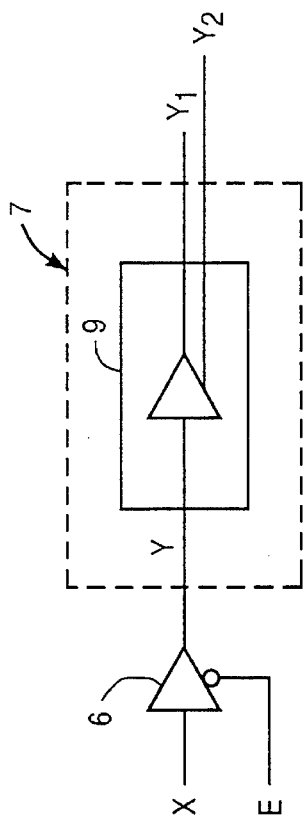
FIG. 3A is a schematic view showing a logic state detector according to the present invention.

FIG. 3A shows a schematic view of a logic circuit device incorporating a logic state detector 7' according to the present invention coupled to a signal output circuit, which is a logic circuit 6' in this embodiment. Logic circuit 6' can output a reference high level signal, a reference low level signal, or a floating state signal at its output terminal Y. Logic state detector 7' includes a signal-receiving terminal 8 for electrical connection to logic circuit 6', and a detecting circuit 9 electrically connected to signal-receiving terminal 8.

In broad terms, logic state detector provides three possible combinations of levels at first and second output terminals $Y_1$ and $Y_2$. This is sufficient to distinguish the two possible defined states and a floating state at terminal Y.

Figure 3B:
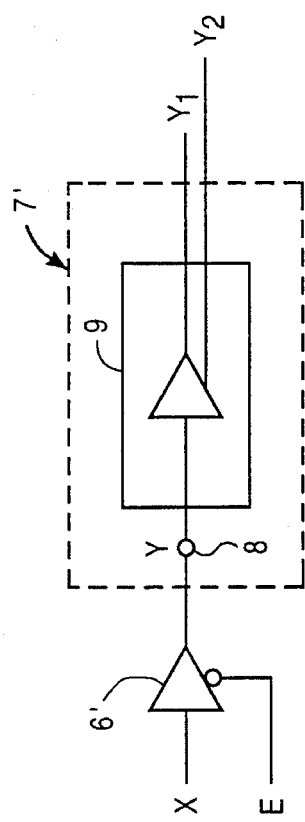
FIG. 3B is a further schematic view showing a logic state detector according to the present invention.

FIG. 3B shows another schematic view of a logic state detector 7 according to the present invention, which includes a tri-state logic circuit 6 having an output terminal Y, a data input terminal X for receiving an input signal, and an enabling input terminal E for receiving a first control signal level or a second control signal level, and a detecting circuit 9 electrically connected to tri-state logic circuit 6 and having a first and second output terminals $Y_1$ and $Y_2$. The signal on output terminal $Y_2$ tracks the input signal when enabling terminal E is provided with the first control signal level and outputs a particular output signal when enabling terminal E is provided with the second control signal level. The signal on output terminal $Y_2$ is a first output signal level in response to the first control signal level and a second output signal level in response to the second control signal level.

The input signal at data signal terminal X and the control signal at enabling input terminal E can be one of a reference high and a reference low level signals, respectively, higher and lower than a minimum of a reference high voltage level, $V_{H(min)}$, and a maximum of a reference low voltage level, $V_{L(max)}$.

As will be described below, there are many choices as to whether the output enable control signal will be active high or active low, and what the unique combinations of signals at output terminals will be. The truth table for a first specific embodiment of the logic state detector is defined as follows:

| X  | E | Y | $Y_1$ | $Y_2$ |
|----|---|---|-------|-------|
| L  | L | L | L     | L     |
| H  | L | H | H     | L     |
| X* | H | F | L*    | H     |

X* for data input terminal X means input terminal X can either be at "H" or "L". When output terminal Y is floating, output terminal $Y_1$ is defined to be at "L" in the above table although it could alternatively be defined to be at "H". Thus the notation L*.

From the truth table, it can be seen that when control input terminal E is at "L", output terminal Y and input terminal X have the same logic state, as do output terminals Y and $Y_1$. Furthermore, output terminal $Y_2$ is at "L". On the other hand, when input terminal E is at "H", regardless of whether input terminal X is at "H" or "L", output terminal Y is at "F", output terminal $Y_1$ is at "L" and output terminal $Y_2$ is at "H". Accordingly, it can be known that output terminal Y is at "F" if output terminal $Y_2$ is at "H".

Logic Diagrams for Additional Embodiments

The embodiment discussed above detects three possible states of the input line (terminal Y), and provides the logic state (if the input is not floating) on output terminal $Y_1$ and "H" on output terminal $Y_2$ if the input is floating. There are other possibilities, as will now be described.

Figure 3C:
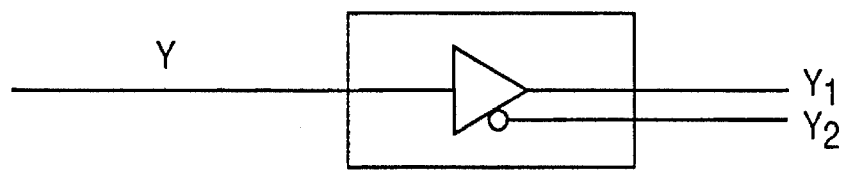
FIGS. 3C–3Q are schematic views of alternative embodiments.

FIG. 3C is a schematic for implementing the following truth table:

| Y | $Y_1$ | $Y_2$ |
|---|-------|-------|
| L | L     | H     |
| H | H     | H     |
| F | L*    | L     |

Figure 3D:
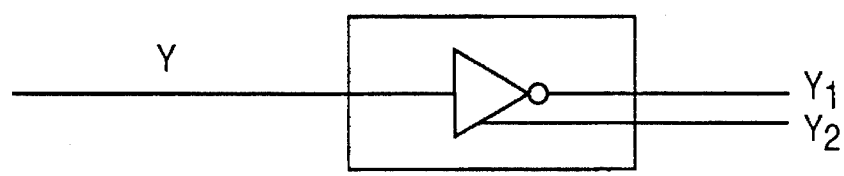

FIG. 3D is a schematic for implementing the following truth table:

| Y | $Y_1$ | $Y_2$ |
|---|-------|-------|
| L | H     | L     |
| H | L     | L     |
| F | L*    | H     |

Figure 3E:
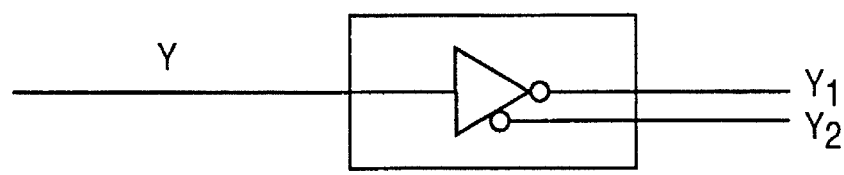

FIG. 3E is a schematic for implementing the following truth table:

| Y | $Y_1$ | $Y_2$ |
|---|-------|-------|
| L | H     | H     |
| H | L     | H     |
| F | L*    | L     |

Figure 3F:
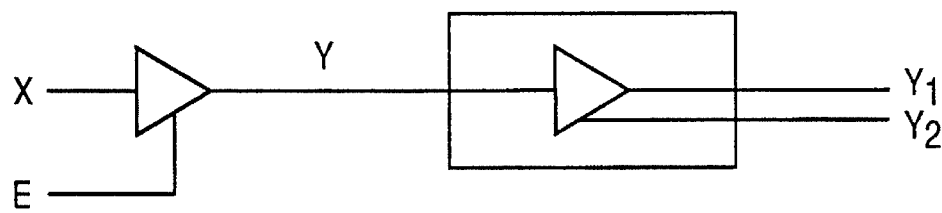

FIG. 3F is a schematic for implementing the following truth table:

| X  | E | Y | $Y_1$ | $Y_2$ |
|----|---|---|-------|-------|
| L  | H | L | L     | L     |
| H  | H | H | H     | L     |
| X* | L | F | L*    | H     |

Figure 3G:
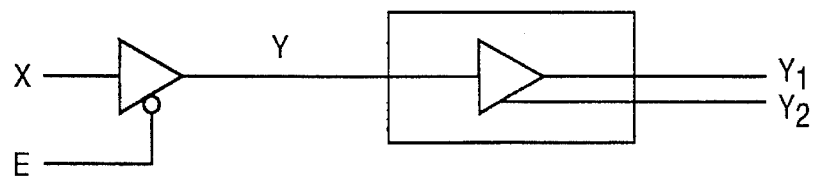

FIG. 3G is a schematic for implementing the following truth table:

| X  | E | Y | $Y_1$ | $Y_2$ |
|----|---|---|-------|-------|
| L  | L | H | L     | L     |
| H  | L | L | H     | L     |
| X* | H | F | L*    | H     |

Figure 3H:
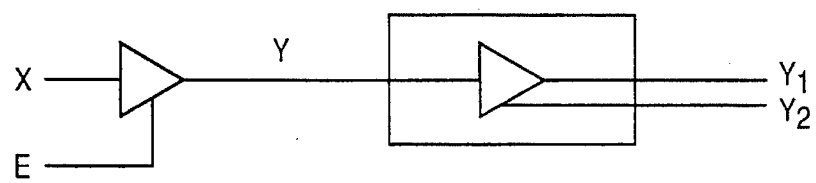

FIG. 3H is a schematic for implementing the following truth table:

| X  | E | Y | $Y_1$ | $Y_2$ |
|----|---|---|-------|-------|
| L  | H | H | L     | L     |
| H  | H | L | H     | L     |
| X* | L | F | L*    | H     |

Figure 3I:
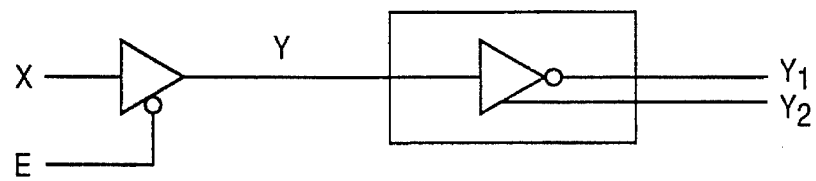

FIG. 3I is a schematic for implementing the following truth table:

| X  | E | Y | $Y_1$ | $Y_2$ |
|----|---|---|-------|-------|
| L  | L | L | H     | L     |
| H  | L | H | L     | L     |
| X* | H | F | L*    | H     |

Figure 3J:
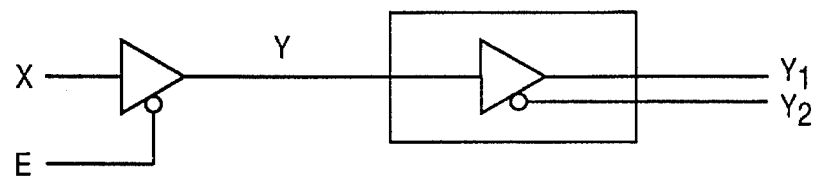

FIG. 3J is a schematic for implementing the following truth table:

| X  | E | Y | $Y_1$ | $Y_2$ |
|----|---|---|-------|-------|
| L  | L | L | L     | H     |
| H  | L | H | H     | H     |
| X* | H | F | L*    | L     |

Figure 3K:
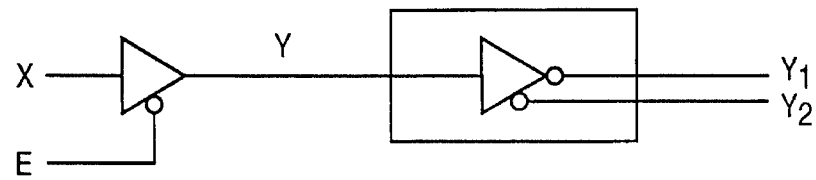

FIG. 3K is a schematic for implementing the following truth table:

| X  | E | Y | $Y_1$ | $Y_2$ |
|----|---|---|-------|-------|
| L  | L | L | H     | H     |
| H  | L | H | L     | H     |
| X* | H | F | L*    | L     |

Figure 3L:
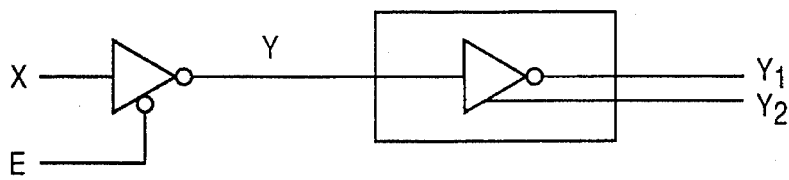

FIG. 3L is a schematic for implementing the following truth table:

| X  | E | Y | $Y_1$ | $Y_2$ |
|----|---|---|-------|-------|
| L  | L | H | H     | L     |
| H  | L | L | L     | L     |
| X* | H | F | L*    | H     |

Figure 3M:
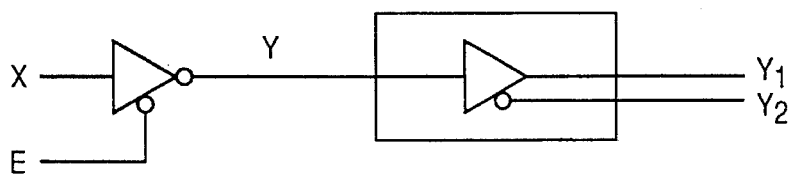

FIG. 3M is a schematic for implementing the following truth table:

| X  | E | Y | $Y_1$ | $Y_2$ |
|----|---|---|-------|-------|
| L  | L | H | L     | H     |
| H  | L | L | H     | H     |
| X* | H | F | L*    | L     |

Figure 3N:
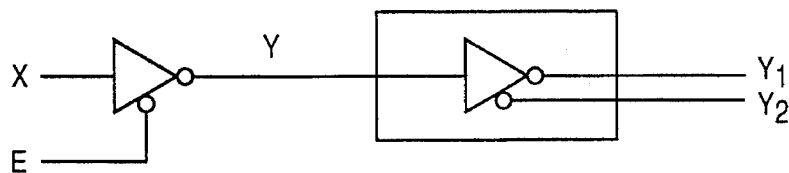

FIG. 3N is a schematic for implementing the following truth table:

| X  | E | Y | $Y_1$ | $Y_2$ |
|----|---|---|-------|-------|
| L  | L | H | H     | H     |
| H  | L | L | L     | H     |
| X* | H | F | L*    | L     |

Figure 3O:
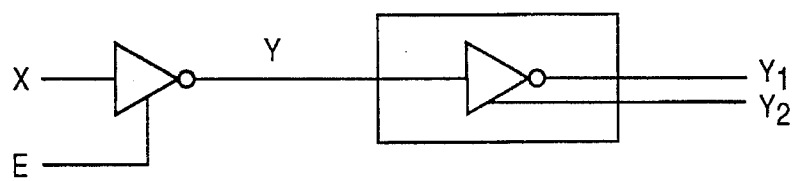

FIG. 3O is a schematic for implementing the following truth table:

| X  | E | Y | $Y_1$ | $Y_2$ |
|----|---|---|-------|-------|
| L  | H | H | L     | H     |
| H  | H | L | H     | H     |
| X* | L | F | L*    | L     |

Figure 3P:
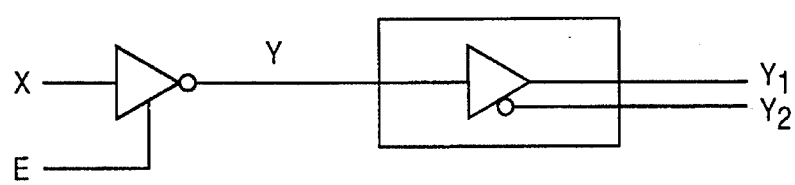

FIG. 3P is a schematic for implementing the following truth table:

| X  | E | Y | $Y_1$ | $Y_2$ |
|----|---|---|-------|-------|
| L  | H | H | L     | H     |
| H  | H | L | H     | H     |
| X* | L | F | L*    | L     |

Figure 3Q:
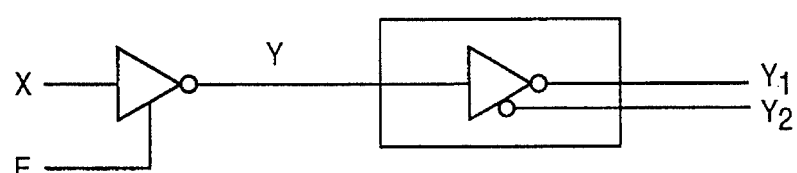

FIG. 3Q is a schematic for implementing the following truth table:

| X  | E | Y | $Y_1$ | $Y_2$ |
|----|---|---|-------|-------|
| L  | H | H | H     | H     |
| H  | H | L | L     | H     |
| X* | L | F | L*    | L     |

Thus, it is clear that there are many additional ways to implement the present invention and still detect the presence of a floating output from the tri-state logic.

Circuit Implementation of the First Specific Embodiment

Figure 4:
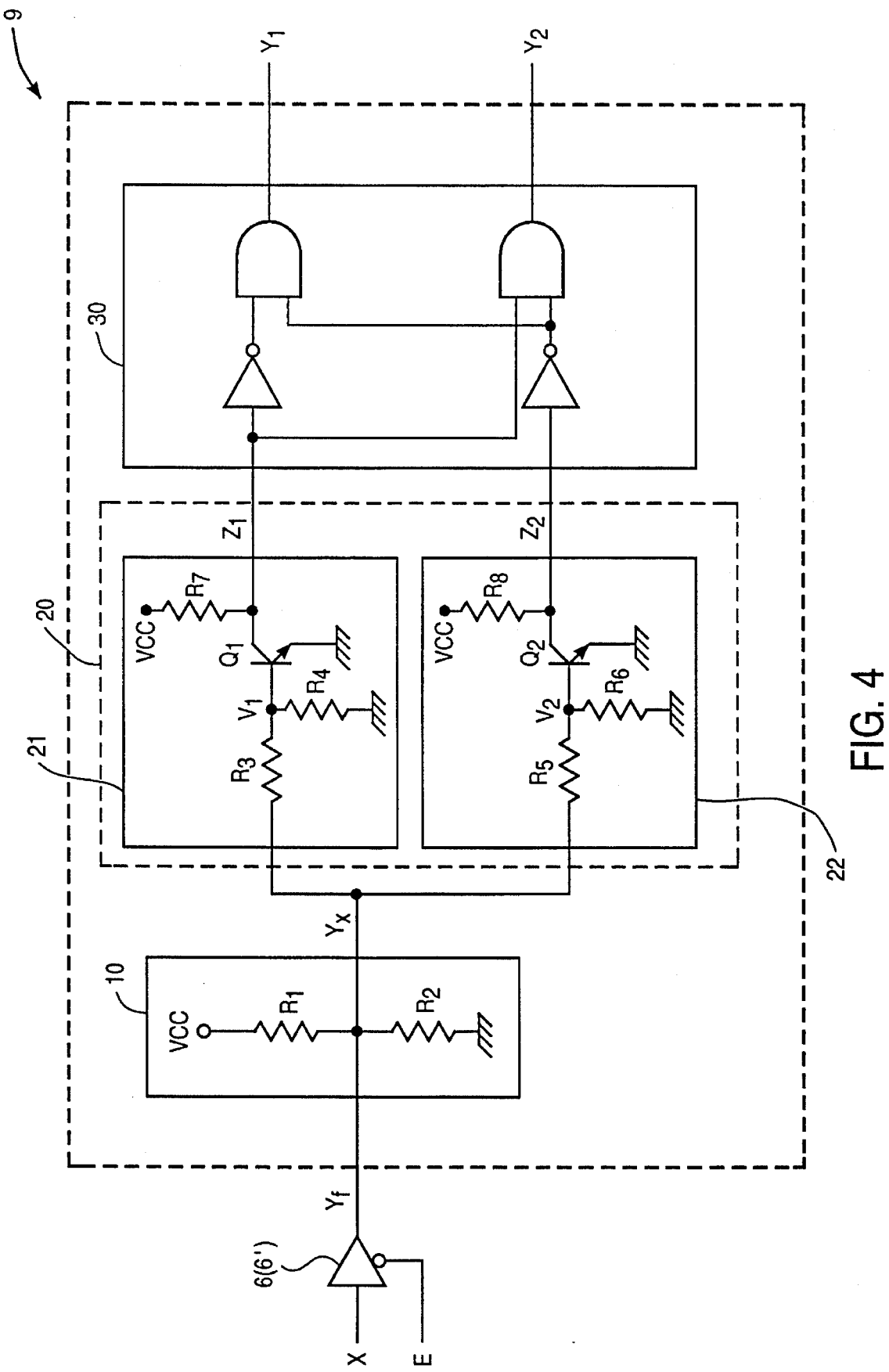
FIG. 4 is a circuit diagram showing a specific embodiment of a logic state detector according to the present invention.

FIG. 4 is a circuit schematic of the first specific embodiment of the logic state detector including detecting circuit 9 for detecting whether tri-state circuit 6 (6') outputs a reference high level signal, a reference low level signal, or a floating state signal at its output terminal $Y_f$. Detecting circuit 9 includes a level generator 10, signal detecting (comparison) circuitry 20, and optional output logic 30. Level generator 10 is electrically connected to tri-state circuit 6 (6'), and generates a fixed reference electrical level at its output terminal $Y_x$ in response to the floating state signal. This reference voltage lies between the minimum of a reference high voltage level ($V_{H(min)}$) and the maximum of a reference low voltage level ($V_{L(max)}$). Signal detecting circuitry 20 is electrically connected to level generator 10, and generates logic signal outputs at its output terminals $Z_1$ and $Z_2$.

Output logic 30 is electrically connected to signal detecting circuitry 20, and provides remapped signals at output terminals $Y_1$ and $Y_2$ in response to the logic signal outputs of signal detecting circuitry 20. Output logic 30 includes a pair of AND gates and a pair of inverters, connected so that $Y_1=Z_1'Z_2'$ and $Y_2=Z_1Z_2'$.

Level generator 10 in this embodiment is a voltage divider dividing the power supply for detecting circuit 9 and is designed to avoid loading the output of tri-state circuit 6(6'). If $V_{L(max)}$ is set to be 0.8 volts, $V_{H(min)}$ is set to be 2.2 volts, and Vcc, R1, and R2 are respectively set to be 5 volts, 7 MΩ, and 3 MΩ, then a fixed reference level of 1.5 volts ($V_M$) appears at output terminal $Y_x$ when $Y_F$ is floating, without adversely influencing the outputs at output terminal $Y_f$ when control input terminal E is at "L".

Thus, when respectively provided with a reference high and a reference low level signal, level generator 10 will respectively output the reference high and low level signals, but will provide a fixed voltage of 1.5 volts ($V_M$) at output terminal $Y_x$ when tri-state logic circuit 6 (6') outputs the floating state signal at output terminal $Y_f$. As shown in FIG. 4A, level generator 10 can alternatively be an externally applied voltage $V_M$ electrically connected to a resistor $R_M$ having a resistance of $R_1R_2/(R_1+R_2)$.

Signal detecting circuitry 20 includes a first threshold circuit 21 electrically connected to level generator 10 for outputting a reference high level signal when the output voltage of level generator 10 is lower than a first critical voltage and a second threshold circuit 22 electrically connected to electric level generator 10 for outputting a reference low level signal when the output voltage of level generator 10 is higher than a second critical voltage.

First and second threshold circuits 21 and 22 respectively include transistors $Q_1$ and $Q_2$. The first critical voltage is one half the sum of the reference level and a minimum of the reference high voltage level; the second critical voltage is one half the sum of the reference level and a maximum of the reference low voltage level for the present logic state detector.

When the voltage at output terminal $Y_x$ is higher than or equal to $(V_{H(min)}+V_M)/2$, e.g., (2.2+1.5)V/2=1.85 volts, transistor $Q_1$ in first threshold circuit 21 will be turned on so that output terminal $Z_1$ will be at "L". Otherwise, transistor $Q_1$ will be OFF and output terminal $Z_1$ will be at "H". The divided voltage $V_1$ is adjusted by means of resistors R3 and R4 which should be designed so as not to influence the output potential at output terminal $Y_x$.

When the voltage at output terminal $Y_x$ is higher than or equal to $(V_M+V_{L(max)})/2$, e.g. (1.5+0.8)V/2=1.15 volts, transistor $Z_2$ in second threshold circuit 22 will be turned on so that output terminal $Z_2$ will be at "L". Otherwise, transistor $Q_2$ will be OFF and output terminal $Z_2$ is at "H". The divided voltage $V_2$ is adjusted by means of resistors R5 and R6 which should be designed so as not to influence the output potential at output terminal $Y_x$.

The truth table for the circuit diagram in FIG. 4 is as follows:

| X  | E | Y($Y_f$,$Y_x$) | $Q_1$ | $Q_2$ | $Z_1$ | $Z_2$ | $Y_1$ | $Y_2$ |
|----|---|----------------|-------|-------|-------|-------|-------|-------|
| L  | L | L              | OFF   | OFF   | H     | H     | L     | L     |
| H  | L | H              | ON    | ON    | L     | L     | H     | L     |
| X* | H | F              | OFF   | ON    | H     | L     | L     | H     | wherein the meanings of the symbols are respectively the same as those of the ones above described. Thus, the circuit implements the desired truth table and thus operates as a logic state detector achieving the desired result.

Other Applications

The present logic state detector has a number of other applications. A device having the truth table of the first specific embodiment will be used for illustration.

Figure 5:
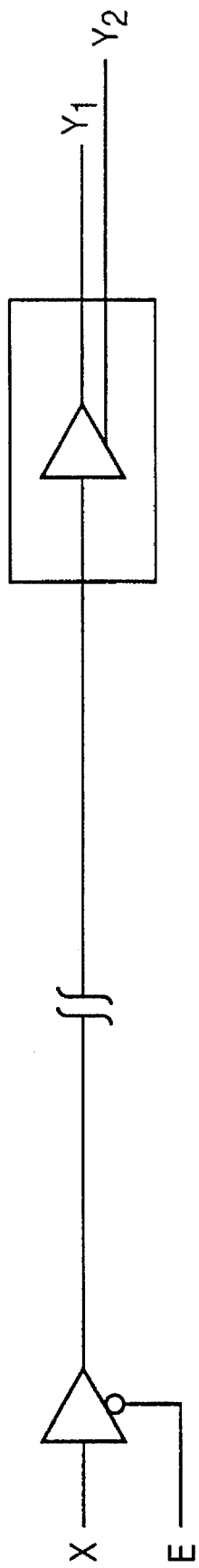
FIG. 5 is a schematic view showing an application of a logic state detector according to the present invention.

As a first example, it can be used in combination with a tri-state device for transmitting and detecting three kinds of signals on a single signal transmission line. FIG. 5 shows a circuit device having the following truth table:

| X | E | $Y_1$ | $Y_2$ |
|---|---|-------|-------|
| L | L | L     | L     |
| H | L | H     | L     |
| L | H | L     | H     |

Since a transmission line embodying a logic state detector according to the present invention can transmit three kinds of signals, or one and a half times the two kinds of signals of the conventional logic circuit, the number of logic states that can be specified by a set of transmission lines will be increased by $(1.5)^n$ times if n transmission lines are used.

Figure 6:
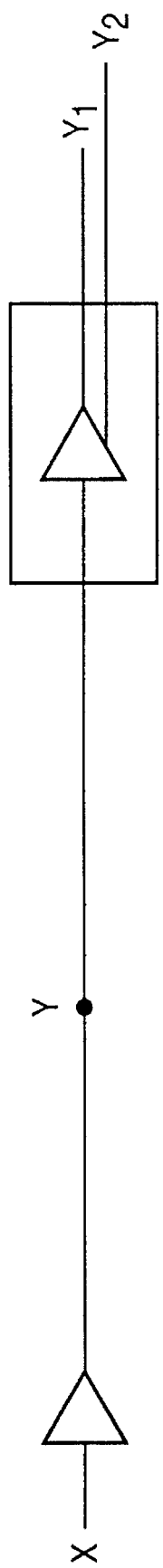
FIG. 6 is a schematic view showing a further application of a logic state detector according to the present invention.

In a second example, the present logic state detector can be used in combination with a normal driver on a transmission line to detect whether the transmission line is broken. FIG. 6 shows a circuit device having the following truth table:

| X     | $Y_1$ | $Y_2$ |
|-------|-------|-------|
| L     | L     | L     |
| H     | H     | L     |
| Break | L     | H     |

When the circuit device is normal, the output terminal $Y_2$ is at "L" and the output terminal $Y_1$ and the input terminal X have the same logic state. However, when the circuit device is broken at the output terminal Y, output terminal $Y_2$ will be at "H" to denote that the transmission line is broken.

Figure 7:
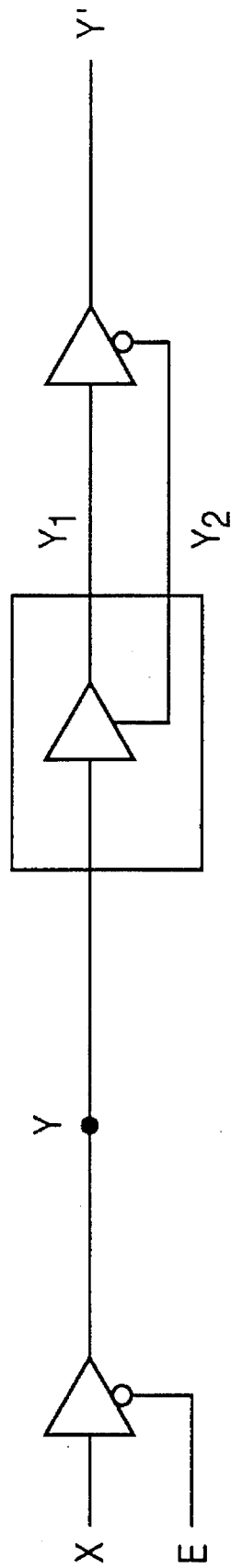
FIG. 7 is a schematic view showing an additional application of a logic state detector according to the present invention.

As a third example, the present logic state detector is electrically connected to a tri-state logic circuit for serving as a signal buffer circuit for a newly connected tri-state logic circuit. FIG. 7 shows a circuit device having the following truth table:

| X  | E | Y | Y1 | Y2 | Y' |
|----|---|---|----|----|----|
| L  | L | L | L  | L  | L  |
| H  | L | H | H  | L  | H  |
| X* | H | F | L  | H  | F  |

From this truth table, it can be seen that when the enabling input terminal E is respectively inputted with the first control signal "L" and the second control signal "H", the first output terminal $Y_2$ serving as the enabling input terminal of the newly connected tri-state logic circuit will respectively output the first control signal "L" and the second control signal "H" to achieve the buffering effect.

Conclusion

In conclusion it can be seen that the present invention provides a simple and elegant technique for providing additional information regarding tri-state circuits. The invention goes beyond that, providing additional applications dealing with signal transmission and additional uses of tri-state circuits. While the above is a complete description of a number of embodiments of the invention, including a specific circuit implementation, various modifications, alternative constructions, and equivalents may be used. Therefore, the above description and illustration should not be taken as limiting the scope of the invention which is defined by the claims.

What is claimed is:

1. A circuit for determining whether an input signal represents a logic high, a logic low, or is floating, comprising:

a voltage level generator having an input terminal for receiving said input signal and an output terminal electrically common with the input terminal, the voltage level generator providing at the output terminal (a) a first voltage representing a logic low when said input signal represents a logic low, the first voltage lying in a first fixed voltage range, the first voltage range including a maximum voltage, (b) a second voltage representing a logic high when said input signal represents a logic high, the second voltage lying in a second fixed voltage range, the second voltage range including a minimum voltage, and (c) a third voltage, between said maximum voltage of the first voltage range and the minimum voltage of the second voltage range, when said input signal is floating;

a first threshold circuit having an output terminal, coupled to said voltage level generator, for generating a logical high signal at the output terminal of said first threshold circuit if and only if said voltage at the output terminal of said voltage level generator is above a fourth voltage between said minimum voltage of the second voltage range and the third voltage, said first threshold circuit including a first voltage divider for dividing the voltage at the output terminal of said voltage level generator;

a second threshold circuit having an output terminal, coupled to said voltage level generator, for generating a logical high signal at the output terminal of said second threshold circuit if and only if said voltage at the output terminal of said voltage level generator is above a fifth voltage between said maximum voltage of the first voltage range and third voltage, said second threshold circuit including a second voltage divider for dividing the voltage at the output terminal of said voltage level generator; and a logic circuit, coupled to said first and second threshold circuits and having a pair of output terminals, for providing a first unique combination of logic levels if said input signal represents a logic high, a second unique combination of logic levels if said input signal represents a logic low, and a third unique combination of logic levels if said input signal is floating.

2. A circuit combination comprising:

a first circuit having a first data input terminal, an output terminal, and a first output enable terminal, said first circuit providing at said data output terminal of said first circuit (a) a signal that is in a predetermined relationship with respect to a signal at said first data input terminal when a signal at said first output enable terminal is in a first state, and (b) a floating state when a signal at said first output enable terminal is in a second state;

a second circuit having a second data input terminal coupled to said data output terminal of said first circuit and having first and second output terminals, said second circuit providing first and second logic signals on said first and second output terminals, respectively, wherein a first unique combination of values of said logic signals denotes that the signal at said second data input terminal represents a logic low, a second unique combination of values of said logic signals denotes that the signal at said second data input terminal represents a logic high, and a third unique combination of values of said logic signals denotes that the signal at said second data input terminal is floating; and a third circuit having a third data input terminal coupled to said first output terminal of said second circuit, an output terminal, and a second output enable terminal coupled to said second output terminal of said second circuit, said third circuit providing at said data output terminal of said third circuit (a) a signal that is in a predetermined relationship with respect to a signal at said third data input terminal when a signal at said second output enable terminal is in a first state, and (b) a floating state when a signal at said second output enable terminal is in a second state.

3. The circuit of claim 2 wherein said second circuit comprises:

a voltage level generator that provides first and second voltage levels in response to first and second states of said signal at said data output terminal of said first circuit, and a third voltage level when said signal at said data output terminal of said first circuit is floating; and a signal detecting circuit, coupled to said voltage level generator, that distinguishes among said first, second, and third voltage levels.

4. The circuit of claim 3 wherein said second circuit further comprises:

an output circuit, coupled to said signal detecting circuit for generating said first and second logic signals.

5. The circuit of claim 2 wherein said first, second, and third unique combinations are such that:

said signal at said output terminal of said third circuit is in a predetermined relationship with respect to said signal at said first data input terminal when said signal at said first output enable terminal is in said first state; and said signal at said output terminal of said third circuit is floating when said signal at said first output enable terminal is in said second state.

6. The circuit of claim 1, wherein (a) said first threshold circuit (21) comprises:

a first resistor (R3) having its one end connected to the output terminal of the voltage level generator (Yx);

a second resistor (R4) having its one end connected to the other end of the first resistor and having its other end connected to ground;

a first electronic switch (Q1) having first and second terminals and a control input, the control input of the first electronic switch being connected to the other end of the first resistor and controlling the current flowing through the first electronic switch between the first electronic switch's first and second terminals, the first electronic switch's second terminal being connected to ground; and a third resistor (R7) having its one end connected to an upper supply potential (VCC) and its other end being electrically common with the first terminal of the first electronic switch and the output terminal of the first threshold circuit; and (b) the second threshold circuit (22) comprises:

a fourth resistor (R5) having its one end connected to the output terminal of the voltage level generator (Yx);

a fifth resistor (R6) having its one end connected to the other end of the fourth resistor and having its other end connected to ground;

a second electronic switch (Q2) having first and second terminals and a control input, the control input of the second electronic switch being connected to the other end of the fourth resistor and controlling the current flowing through the second electronic switch between the second electronic switch's first and second terminals, the second electronic switch's second terminal being connected to ground a sixth resistor (R8) having its one end connected to the upper supply potential (VCC) and its other end being electrically common with the first terminal of the second electronic switch and the output terminal of the second threshold circuit.

7. The circuit of claim 6 wherein the voltage level generator (10) comprises:

a seventh resistor (R1) having its one end connected to the upper supply potential (VCC) and its other end connected to the output terminal of the voltage level generator; and an eighth resistor (R2) having its one end connected to ground and its other end connected to the output terminal of the voltage level generator.

8. The circuit of claim 6 wherein the voltage level generator (10') comprises:

a voltage source ($V_M$) for generating the third voltage;

a resistor ($R_M$) having its one end connected to the voltage source and its other end connected to the output terminal of the voltage level generator.

9. The circuit of claim 6, wherein the first and second electronic switches are bipolar transistors, the first terminals of the first and second electronic switches are collector terminals, the second terminals of the first and second electronic switches are emitter terminals, and the control inputs of the first and second electronic switches are base inputs.

10. The circuit of claim 1, wherein:

said first unique combination of logic levels is high-low;

said second unique combination of logic levels is low-low; and said third unique combination of logic levels is low-high.

* * * * *